(12) United States Patent
Knudsen

(10) Patent No.: US 11,678,099 B2
(45) Date of Patent: Jun. 13, 2023

(54) HEARING DEVICE WITH PRINTED CIRCUIT BOARD ASSEMBLY

(71) Applicant: GN Hearing A/S, Ballerup (DK)

(72) Inventor: Emil Holm Knudsen, Copenhagen (DK)

(73) Assignee: GN HEARING 2 A/S, Ballerup (DK)

( * ) Notice: Subject to any disclaimer, the term of this patent is extended or adjusted under 35 U.S.C. 154(b) by 60 days.

(21) Appl. No.: 17/202,350

(22) Filed: Mar. 16, 2021

(65) Prior Publication Data

US 2021/0306730 A1  Sep. 30, 2021

(30) Foreign Application Priority Data

Mar. 30, 2020 (EP) .................................... 20166546

(51) Int. Cl.
*H04R 1/10* (2006.01)
*H05K 1/14* (2006.01)

(52) U.S. Cl.
CPC ......... *H04R 1/1025* (2013.01); *H04R 1/1041* (2013.01); *H05K 1/147* (2013.01); *H05K 2201/056* (2013.01); *H05K 2201/1003* (2013.01); *H05K 2201/10037* (2013.01)

(58) Field of Classification Search
CPC .. H04R 1/1025; H04R 1/1041; H04R 1/1016; H04R 1/10; H05K 1/147; H05K 2201/056; H05K 2201/1003; H05K 2201/10037
See application file for complete search history.

(56) References Cited

U.S. PATENT DOCUMENTS

| | | | |
|---|---|---|---|
| 6,456,720 B1 * | 9/2002 | Brimhall ............... | H04R 25/658 381/322 |
| 9,491,880 B2 * | 11/2016 | Rye ......................... | H05K 7/08 |
| 10,827,249 B1 * | 11/2020 | Pine ..................... | H04R 1/1041 |
| 2016/0050474 A1 | 2/2016 | Rye et al. | |
| 2017/0064830 A1 * | 3/2017 | Jiang ..................... | H04R 1/1075 |
| 2018/0054682 A1 * | 2/2018 | Shenoy ................ | H04R 25/609 |

FOREIGN PATENT DOCUMENTS

DE         8426609 U1     12/1985

OTHER PUBLICATIONS

European Search Report dated Sep. 1, 2020 for related EP Appln. No. 20166546.0.

* cited by examiner

*Primary Examiner* — Jason R Kurr
(74) *Attorney, Agent, or Firm* — Vista IP Law Group, LLP

(57) ABSTRACT

Disclosed is a hearing device configured to be worn in an ear of a user. The hearing device is configured to provide an audio signal to the user. The hearing device comprises a circuit assembly. The circuit assembly comprises a printed circuit board assembly. The printed circuit board assembly comprises: a first circuit board; a second circuit board; a third circuit board interconnected with the first circuit board and the second circuit board; and a fourth circuit board. The circuit assembly comprises a battery, wherein the printed circuit board assembly is folded about the battery.

18 Claims, 8 Drawing Sheets

HEARING DEVICE WITH PRINTED CIRCUIT BOARD ASSEMBLY

RELATED APPLICATION DATA

This application claims priority to, and the benefit of, European Patent Application No. EP 20166546.0 filed on Mar. 30, 2020. The entire disclosure of the above application is expressly incorporated by reference herein.

FIELD

The present disclosure relates to a hearing device configured to be worn in an ear of a user. The hearing device is configured to provide an audio signal to the user. The hearing device comprises a circuit assembly comprising a printed circuit board assembly and a battery.

BACKGROUND

Hearing devices are used more and more by all kinds of people. Hearing devices may be used for listening to music, having phone calls etc. Hearing devices may be hearing aids used for compensating a hearing loss of the user.

Small and compact wireless hearing devices are gaining popularity as they are easy to bring along in a bag or pocket, comfortable to wear and visually appealing.

US2016050474A discloses a circuit assembly including a printed circuit board assembly. The printed circuit board assembly includes a first circuit board, a second circuit board, and a first flexible substrate interposed between, and continuous with, the first circuit board and the second circuit board. A second flexible substrate extends from, and is continuous with, the second circuit board. One or more electronic circuits comprising electronic components are disposed along one or more of the first circuit board or the second circuit board. The printed circuit board assembly is folded about a battery, with the first circuit board adjacent to the first major face, the second circuit board adjacent to the second major face, and the first flexible substrate spanning the one or more side faces.

However, there is a need for an improved small and compact hearing device.

SUMMARY

Disclosed is a hearing device configured to be worn in an ear of a user. The hearing device is configured to provide an audio signal to the user. The hearing device comprises a circuit assembly. The circuit assembly comprises a printed circuit board assembly. The printed circuit board assembly comprises: a first circuit board; a second circuit board; a third circuit board interconnected with the first circuit board and the second circuit board; and a fourth circuit board. The circuit assembly comprises a battery, wherein the printed circuit board assembly is folded about the battery.

The hearing device as disclosed provides that the printed circuit board assembly is folded about the battery or wrapped around the battery. It saves space in the hearing device when the printed circuit board assembly can be folded around the battery. Thereby, the hearing device can be small and compact.

A folded printed circuit board assembly in a hearing device may provide that more area of printed circuit board is available for adding further components, functionality etc.

It is an advantage that there is both a first, second, third and fourth circuit board in the printed circuit board assembly, because thereby there is many circuit boards, and thus area, available for proving components and functionality. Thus, more components and functionality may be provided in the present hearing device than in other prior art hearing devices of the same small and compact size.

It is an advantage that the printed circuit board assembly in the present hearing device may be larger than in other hearing devices, because thereby the functionality and performance of the hearing device may be increased.

The hearing device may be a communication device for communication with other devices or users. The hearing device may be a headset for listening to music, performing phone calls etc. The hearing device may be a hearing aid for compensating for the user's hearing loss. The hearing device may be a noise cancellation device for reducing or cancelling noise in the surroundings. The hearing device may be an ear bud or an ear piece.

If the battery is a rechargeable battery, the battery need not be replaced by the hearing device wearer, and therefore the battery can be surrounded by or wrapped in the printed circuit board assembly, as the battery will stay in the hearing device and should not be accessible for the hearing device wearer. Thus, it is an advantage that the battery shall not be accessible or replaced in the hearing device.

Small and compact hearing devices may be an advantage for many reasons. A small and compact hearing device may be cheaper to manufacture, and thereby cheaper for the user to buy. Hearing devices arranged in the outer ear will often cause discomfort for the user after long term use, by making the electronic components of the hearing aid more compact, the hearing device itself can be made smaller, whereby the user may feel more comfort wearing the hearing device. Further, a small and compact hearing device may be more visually attractive/appealing for the users to wear, and thereby the user may be more satisfied with wearing the hearing device, and the user may use/wear the hearing device more often. A small and compact hearing device may be more pleasant for the user to wear, as the small size and possible low weight due to the small size, may be more comfortable in the user's ear. A small and compact hearing device may be easier for the user to carry, e.g. in a bag or pocket.

Furthermore, a small and compact hearing device can be an advantage, because people wearing the hearing device may prefer a small hearing device such that it is too visible that the person is wearing a hearing device. This may be the case if the hearing device is a hearing aid, and the person wishes to hide that he/she is wearing a hearing aid.

The hearing device is configured to be worn in an ear of a user. The hearing device may be arranged in the outer ear of the user. The hearing device may be arranged outside the ear canal of the user. The hearing device may be arranged at the concha of the ear. The hearing device may be arranged adjacent the tragus of the ear.

The hearing device is configured to provide an audio signal to the user. The audio signal may be provided to the user's ear canal through an output transducer in the hearing device. The audio signal may be processed in a processing unit of the hearing device. The audio signal may be inputted in the hearing device through a microphone in the hearing device, for example if the hearing device is a hearing aid for compensating a hearing loss of the user. The audio signal may be inputted in the hearing device through streaming from or connection to another device, such as from a telephone, mobile phone, electronic device etc. The audio signal may be sounds, surrounding sounds, speech from other people, music, a telephone call, media streaming etc.

The hearing device comprises a circuit assembly. The circuit assembly may comprise an electronic circuit. The circuit assembly may be composed of individual electronic components, such as resistors, transistors, capacitors, inductors and diodes, connected by conductive wires or traces through which electric current can flow. The combination of components and wires allows various simple and complex operations to be performed: signals can be amplified, computations can be performed, and data can be moved from one place to another.

The circuit assembly comprises a printed circuit board assembly. The printed circuit board (PCB) mechanically supports and electrically connects the electrical or electronic components using conductive tracks, pads and other features etched from one or more sheet layers of copper laminated onto and/or between sheet layers of a non-conductive substrate. The components may be soldered onto the PCB to both electrically connect and mechanically fasten them to it. The printed circuit board may comprise more layers, such as six layers.

The printed circuit board assembly comprises: a first circuit board; a second circuit board; a third circuit board interconnected with the first circuit board and the second circuit board; and a fourth circuit board. Thus, the printed circuit board assembly comprises four circuit boards which are connected, such as interconnected, with each other. There are different ways by which the four circuit boards can be connected to each other. The four circuit boards may be different circuit boards, such as printed circuit boards and/or flexible circuit boards.

If the circuit board is a flexible circuit board, there may be e.g. 2 layers of material. A flexible circuit board is flexible and bendable. A flexible circuit board may be made of soft and bendable plastic or other flexible material.

The third circuit board may be shaped in different ways depending on which of the other circuit boards the third circuit board is connected to and in what configuration. The third circuit board may for example be cross-shaped, T-shaped, or straight. The first, second, fourth and/or fifth circuit boards may be shaped as traditional printed circuit boards, e.g. rectangular, oval, circular etc.

The printed circuit board assembly, when unfolded, may have a length in a first direction of less than 30 mm, such as less than 25 mm, such as less than 20 mm, such as less than 15 mm, such as less than 10 mm. The printed circuit board assembly, when unfolded, may have a length in a second direction of less than 30 mm, such as less than 25 mm, such as less than 20 mm, such as less than 15 mm, such as less than 10 mm.

The first direction of the printed circuit board assembly may be perpendicular to the second direction of the printed circuit board assembly.

Each of the individual circuit boards, i.e. the first, second, third and/or fourth circuit board may each have a length in a first direction of less than 15 mm, such as less than 10 mm, such as less than 5 mm, such as less than 2.5 mm. Each of the individual circuit boards, i.e. the first, second, third and/or fourth circuit board may each have a length in a second direction of less than 15 mm, such as less than 10 mm, such as less than 5 mm, such as less than 2.5 mm. The first direction of each circuit board may be perpendicular to the second direction of the circuit board.

The circuit assembly comprises a battery. The battery provides power to the circuit assembly and thus to the hearing device. The battery may be a rechargeable battery, which shall not be replaced in the hearing device, but which can remain in the hearing device for the entire life time of the hearing device, or for more years etc. The battery may be recharged by placing the hearing device with the battery in a charging device, such as a charging case. The rechargeable battery may be a lithium-ion battery, a silver-zinc battery, etc. The battery may be shaped as a cylinder. The battery may be shaped as a rectangular box. The battery may be a disc-shaped battery. The battery may be button-type battery. The battery may be flat. The battery may have a length/diameter of less than 10 mm, such as less than 8 mm, such as less than 6 mm, such as less than 4 mm. The battery may have a height/thickness of less than 10 mm, such as less than 8 mm, such as less than 6 mm, such as less than 4 mm, such as less than 2 mm.

The printed circuit board assembly is folded about the battery. The battery comprises one or more sides, faces or surfaces. The printed circuit board assembly covers at least a part of the one or more faces of the battery. One circuit board of the printed circuit board assembly may cover at least a part of one face of the battery. Another circuit board of the printed circuit board assembly may cover at least a part of another face of the battery, etc.

At least a part of the printed circuit board assembly is flexible or bendable. At least a part of the printed circuit board assembly can be bended. Thereby, the printed circuit board assembly can be folded about the battery. When the printed circuit board assembly and the battery are arranged in the hearing device, the printed circuit board assembly is folded about the battery. When the printed circuit board assembly and the battery are not arranged in the hearing device, the printed circuit board assembly may not be folded, but may be outstretched, straight or flat.

The printed circuit board assembly may be a rigid-flex circuit, i.e. a hybrid construction flex circuit consisting of rigid and flexible substrates which are laminated together into a single structure. The first, second, fourth, and/or fifth circuit board(s) may be rigid circuit board(s), while the third circuit board is flexible, whereby the flexible structure of the third circuit board allows the printed circuit board assembly to be folded about the battery. The third circuit board has a thickness (t). The bend radius of the third circuit board may be smaller than 5 mm or smaller than 150×(t).

Alternatively, the third circuit board may also be a rigid circuit board, and the first, second, third, fourth, and/or fifth circuit board(s) may be interconnected by means of flexible sections with a bend radius of less than 5 mm. In an embodiment, the first, second, fourth, and/or fifth circuit board(s) have a larger bend radius than the third printed circuit board and/or than the flexible sections.

In some embodiments the first, second and fourth circuit boards are printed circuit boards. In some embodiments the third circuit board is a flexible circuit board. The printed circuit boards may comprise more layers, such as six layers. The printed circuit board may be hard. The printed circuit boards may comprise electronic components, such as resistors, transistors, capacitors, inductors and diodes, connected by conductive wires or traces through which electric current can flow. The flexible circuit board may comprise one or more layers, such a two layers. The flexible circuit board is flexible and bendable. The flexible circuit board is soft and may not break if bended. The flexible circuit board may comprise conductive wires or traces through which electric current can flow. One or more of the printed circuit boards are connected with the flexible circuit board. The conductive wires or traces of one or more of the printed circuit boards are connected with or extends as the conductive wires or traces of the flexible circuit board.

In some embodiments the first circuit board and second circuit board are arranged opposite each other. When the printed circuit board assembly is folded about the battery, the first circuit board and the second circuit board may be arranged opposite each other.

In some embodiments the battery comprises a first major face, a second major face and one or more side faces. In some embodiments, the printed circuit board assembly is folded about the battery with the first circuit board adjacent the first major face, the second circuit board adjacent the second major face, the third circuit board adjacent at least one of the one or more side faces and the fourth circuit board adjacent at least one of the one or more side faces.

Thus, the first major face and the second major face of the battery may be opposite each other. Both the third and fourth circuit boards may be adjacent at least one of the one or more side faces of the battery. The battery may be shaped as a cylinder. The cylinder may be a circular cylinder, and/or a right cylinder. The first and second major face of the battery may correspond to the two bases of a cylinder. The side face of the battery may correspond to the lateral area of a cylinder. If the battery is shaped as a cylinder, the battery may only have one side face, and the third and the fourth circuit boards are adjacent a part of the side face of the battery.

The surface of the circuit board pointing towards the battery, when the printed circuit board assembly is folded about the battery, may be the second surface of the circuit board. The surface of the circuit board pointing towards the surroundings, when the printed circuit board assembly is folded about the battery, may be the first surface of the circuit board. Thus, the second surface of the first circuit board is opposite the second surface of the second circuit board. The second surface of the first circuit board may be adjacent the first major face of the battery. The second surface of the second circuit board may be adjacent the second major face of the battery.

In some embodiments the third circuit board comprises one or more bends. When the printed circuit board assembly is folded about the battery, then the third circuit board comprises one or more bends such that the entire printed circuit board assembly can surround, enclose, encase the battery. The third circuit board comprises the one or more bends and is bendable because the third circuit board is flexible. The third circuit board may comprise a bend at each connection with one or more of the first, second and/or fourth circuit boards, which may be printed circuit boards, which are not flexible. The third circuit board may comprise a first bend at the connection with the first circuit board. The third circuit board may comprise a second bend at the connection with the second circuit board. The third circuit board may comprise a third bend at a connection with the fourth circuit board.

In some embodiments the fourth circuit board is interconnected, via the third circuit board, with the first circuit board and the second circuit board. In this embodiment, both the first, second and fourth circuit boards are connected with the third circuit board.

In some embodiments, the hearing device further comprises a fifth circuit board. The fifth circuit board may be a printed circuit board or a flexible circuit board.

In some embodiments the fourth circuit board and the fifth circuit board are arranged opposite each other. When the printed circuit board assembly is folded about the battery, the fourth circuit board and the fifth circuit board may be arranged opposite each other. The fourth circuit board and the fifth circuit board may be arranged adjacent the side faces, such as adjacent the lateral side face, of the battery.

In some embodiments, the fifth circuit board is interconnected, via the third circuit board, with the first circuit board and the second circuit board. In this embodiment, both the first, second and fifth circuit boards are connected with the third circuit board. The fifth circuit board may also be interconnected, via the third circuit board, with the fourth circuit board.

In some embodiments the fourth circuit board and/or the fifth circuit board is/are connected with the first circuit board. Thus, the fourth circuit board may be connected with the first circuit board instead of via the third circuit board. Thus, the fifth circuit board may be connected with the first circuit board instead of via the third circuit board. A further circuit board, such as a flexible circuit board, may be provided between the fourth circuit board and the first circuit board such that the printed circuit board assembly can be folded about the battery. A further circuit board, such as a flexible circuit board, may be provided between the fifth circuit board and the first circuit board such that the printed circuit board assembly can be folded about the battery.

In some embodiments the fourth circuit board and/or the fifth circuit board is/are connected with the second circuit board. Thus, the fourth circuit board may be connected with the second circuit board instead of via the third circuit board. Thus, the fifth circuit board may be connected with the second circuit board instead of via the third circuit board. A further circuit board, such as a flexible circuit board, may be provided between the fourth circuit board and the second circuit board such that the printed circuit board assembly can be folded about the battery. A further circuit board, such as a flexible circuit board, may be provided between the fifth circuit board and the second circuit board such that the printed circuit board assembly can be folded about the battery.

In some embodiments, the hearing device further comprises power management components. In some embodiments the power management components are provided at the fourth circuit board. The power management components may comprise regulators for regulating the power. The power management components may comprise a power management chip which may implement power management circuits including power regulators. The power management components may be provided for controlling the power provided from the battery to a processing unit, an output transducer, microphone(s), a wireless communication unit (RF), and/or the wireless communication unit (MI). The power management components are provided at the fourth circuit board. Alternatively, the power management may be arranged on the third circuit board. Thereby the battery may provide shielding for other components which are arranged on the other side of the battery relative to the power management components on the fourth circuit board. The power management components may further be covered by a shielding can for providing improved shielding of the power management components.

In some embodiments the hearing device further comprises a magnetic induction coil. In some embodiments the magnetic induction coil is provided opposite the fourth circuit board. The magnetic induction (MI) coil may be a magnetic antenna. The MI coil may be provided adjacent the battery. Thus, the battery is provided between the MI coil and the power management components on the fourth circuit board. Thereby the magnetic induction coil is shielded from electromagnetic noise from the power management components, both due to the distance and due to the battery provided in between.

The magnetic induction coil may be configured for wireless communication. The magnetic induction coil may be configured to operate at a frequency below 100 MHz, such as at below 30 MHz, such as below 15 MHz, during use. The magnetic induction coil may be configured to operate at a frequency range between 1 MHz and 100 MHz, such as between 1 MHz and 15 MHz, such as between 1 MHz and 30 MHz, such as between 5 MHz and 30 MHz, such as between 5 MHz and 15 MHz, such as between 10 MHz and 11 MHz, such as between 10.2 MHz and 11 MHz. The frequency may further include a range from 2 MHz to 30 MHz, such as from 2 MHz to 10 MHz, such as from 2 MHz to 10 MHz, such as from 5 MHz to 10 MHz, such as from 5 MHz to 7 MHz.

In some embodiments the third circuit board has a width. In some embodiments, the third circuit board is connected to the first circuit board and the second circuit board along its entire width. This provides improved strength and stability of the connection between the third circuit board and the other circuit boards. The third circuit board may be connected to the fourth circuit board and/or the fifth circuit board along its entire width. The third circuit board may also have a length and a thickness.

In some embodiments the third circuit board comprises a transition zone at the connection with the first, second, fourth and/or firth circuit board. In some embodiments the thickness of the third circuit board in the transition zone gradually increases. The thickness of the third circuit board in the transition zone gradually increases towards the first, second, fourth and/or firth circuit boards. This provides improved strength and stability of the connection between the third circuit board and the other circuit boards, while still providing the flexibility of the third circuit board such that the printed circuit board assembly can be folded about the battery. The maximum thickness of the third circuit board may be in a range of 0.4-0.6 mm, such as about 0.5 mm, such as 0.53 mm. In some embodiments, the width of the third circuit board in the transition zone may gradually increase towards the first, second, fourth and/or firth circuit boards.

In some embodiments the hearing device further comprises one or more microphones and/or one or more control interfaces. In some embodiments, the one or more microphones and/or the one or more control interfaces are provided at the first circuit board. The microphones may be configured for receiving sound from the surroundings. The received sound may be processed in a processing unit of the hearing device and provided to an output transducer of the hearing device. If the hearing device is a hearing aid, the sound received in the microphone(s) may be processed for compensating for a hearing loss of the user. The control interfaces may be configured for controlling functions of the hearing device, e.g. sound volume, modes etc. The control interface may be provided as buttons on the external surface of the hearing device.

In some embodiments the battery is connected to the printed circuit board assembly through a second electronic component. The second electronic component may be a coil, or an inductor or the like. The second electronic component may be configured to decouple at 2.4 GHz.

In some embodiments the hearing device further comprises an antenna comprising an antenna element, the antenna being configured for emission and reception of electromagnetic radiation at a wavelength (A). In some embodiments the hearing device further comprises a wireless communication unit interconnected with the antenna element. The wireless communication unit may be a radio, such as a radio frequency (RF) radio. The wireless communication device may be provided at the second circuit board or at the fourth circuit board.

In some embodiments the antenna element has a first end connected to a feed, wherein the feed is provided in a portion of the first or third circuit board which is adjacent to the interconnection between the first and third circuit boards. The feed may be a feeding point or excitation point. Alternatively, the antenna element may be printed on a faceplate of the hearing device and connected to the feed. The connection may be via a wire or spring.

It is an advantage that the feed of the antenna or antenna element is provided in a portion of the first or third circuit board which is adjacent the interconnection between the first and third circuit boards. Thereby the antenna element may excite a mode on the printed circuit board assembly. Furthermore, the third circuit board may be a high-current or a maximum-current area. In other words, the printed circuit board assembly may be considered to be part of the antenna, and the current distribution of the antenna may have a maximum current at the third circuit board. It is an advantage as this provides an improved antenna performance. Thus, it is an advantage that a hearing device with increased wireless communication capabilities is provided.

In some embodiments, the hearing device further comprises a first distance between the first major face of the battery and the first circuit board, the first distance having a first predefined value. In some embodiments, the hearing device further comprises a second distance between the second major face of the battery and the second circuit board, the second distance having a second predefined value. The first and second distance provides an air gap between the circuit board and the battery. The antenna performance is further improved when there is this distance/air gap between the circuit board and the battery. Computer simulations show that when there is a distance/air gap, the antenna performance is improved. The surface of the circuit board pointing towards the battery, when the printed circuit board assembly is folded about the battery, may be the second surface of the circuit board. The surface of the circuit board pointing towards the surroundings, when the printed circuit board assembly is folded about the battery, may be the first surface of the circuit board. Thus, the second surface of the first circuit board is opposite the second surface of the second circuit board. The first distance may be between the first major face of the battery and the second surface of the first circuit board. The second distance may be between the second major face of the battery and the second surface of the second circuit board.

In some embodiments, the first distance and/or the second distance is 200-400 micrometer, preferably about 300 micrometer. The first distance and the second distance may be the same or different distances. The antenna performance is further improved when the distance is 200-400 micrometer, preferably about 300 micrometer. Computer simulations show that at these distances, the antenna performance is optimal.

In some embodiments, during operational use of the hearing device, the circuit assembly is arranged such that the third circuit board is provided adjacent the tragus in the ear. This arrangement provides improved antenna performance.

In some embodiments, during operational use of the hearing device, the circuit assembly is arranged such that a first surface of the first circuit board faces towards the surroundings outside of the ear, and a second surface of the first circuit board faces towards the concha of the ear, where the first surface is opposite to the second surface. This arrangement provides improved antenna performance. The second surface of the first circuit board also faces towards the battery.

In some embodiments, the hearing device further comprises an output transducer for providing the audio signal. The output transducer may be a speaker, a loudspeaker, a receiver etc. The audio signal is provided in the ear canal of the user.

The hearing device may be a headset or earbud(s) for audio communication. The hearing device may be a hearing protector for protection of e.g. impulse sounds. The hearing device may be a hearing aid for compensating for a hearing loss of the user. The hearing aid may be any hearing aid, such as a hearing aid of the in-the-ear type, such as in-the-canal type, such as completely-in-the-canal type of hearing aid, etc., a hearing aid of the receiver-in-the-ear type of hearing aid, etc.

The hearing device may comprise a microphone configured for converting an acoustic sound signal from a sound source into an audio signal. The audio signal is configured to be processed in a processing unit for compensation of the hearing loss of the user. The processed audio signal is configured to be converted into a processed acoustic signal by an output transducer.

The hearing device may comprise one or more antennas for radio frequency communication. The one or more antennas may be configured to operate in a first frequency range, such as at a frequency above 800 MHz, such as at a frequency above 1 GHz, such as at a frequency of 2.4 GHz, such as at a frequency between 1.5 GHz and 3 GHz, during use. Thus, the first antenna may be configured for operation in ISM frequency band. The first antenna may be any antenna capable of operating at these frequencies, and the first antenna may be a resonant antenna, such as monopole antenna, such as a dipole antenna, etc. The resonant antenna may have a length of lambda/4 or any multiple thereof, lambda being the wavelength corresponding to the emitted electromagnetic field.

The hearing device may comprise one or more wireless communications unit(s) or radios. The one or more wireless communications unit(s) are configured for wireless data communication, and in this respect interconnected with the one or more antennas for emission and reception of an electromagnetic field. Each of the one or more wireless communication unit may comprise a transmitter, a receiver, a transmitter-receiver pair, such as a transceiver, a radio unit, etc. The one or more wireless communication units may be configured for communication using any protocol as known for a person skilled in the art, including Bluetooth, WLAN standards, manufacture specific protocols, such as tailored proximity antenna protocols, such as proprietary protocols, such as low-power wireless communication protocols, RF communication protocols, magnetic induction protocols, etc. The one or more wireless communication units may be configured for communication using same communication protocols, or same type of communication protocols, or the one or more wireless communication units may be configured for communication using different communication protocols.

The hearing device may be a binaural hearing device. The hearing device may be a first hearing device and/or a second hearing device of a binaural hearing device.

The hearing device may be a device configured for communication with one or more other device, such as configured for communication with another hearing device or with an accessory device or with a peripheral device.

The present disclosure relates to different aspects including the hearing device described above and in the following, and corresponding system parts, methods, devices, systems, networks, kits, uses and/or product means, each yielding one or more of the benefits and advantages described in connection with the first mentioned aspect, and each having one or more embodiments corresponding to the embodiments described in connection with the first mentioned aspect and/or disclosed in the appended claims.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
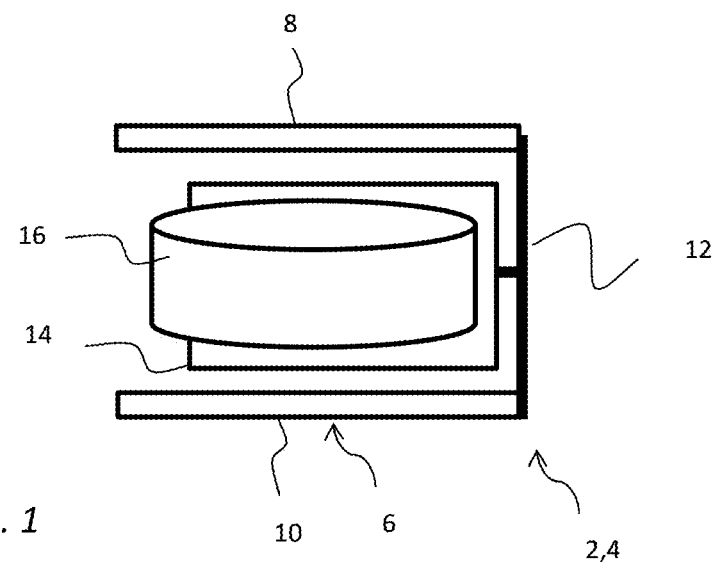
FIG. 1 schematically illustrates an example of a hearing device 2.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Throughout, the same reference numerals are used for identical or corresponding parts.

FIG. 1 schematically illustrates an example of a hearing device 2 configured to be worn in an ear of a user. The hearing device 2 is configured to provide an audio signal to the user. The hearing device 2 comprises a circuit assembly 4. The circuit assembly 4 comprises a printed circuit board assembly 6. The printed circuit board assembly 6 comprises:

a first circuit board 8; a second circuit board 10; a third circuit board 12 interconnected with the first circuit board 8 and the second circuit board 10; and a fourth circuit board 14. The circuit assembly 4 comprises a battery 16, wherein the printed circuit board assembly 6 is folded about the battery 16.

The battery 16 comprises a first major face, a second major face and one or more side faces. The printed circuit board assembly 6 is folded about the battery 16 with the first circuit board 8 adjacent the first major face, the second circuit board 20 adjacent the second major face, the third circuit board 12 adjacent the one or more side faces and the fourth circuit board 14 adjacent the one or more side faces.

The first circuit board 8 and the second circuit board 10 are opposite to each other when the printed circuit board assembly 6 is folded about the battery 16.

Figure 2:
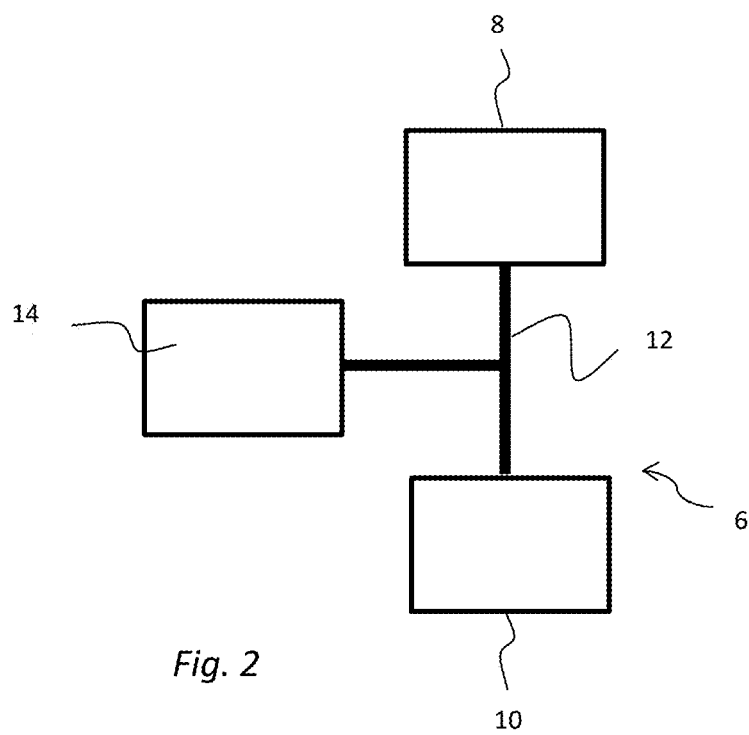
FIG. 2 schematically illustrates an example of a printed circuit board assembly when unfolded.

FIG. 2 schematically illustrates an example of a printed circuit board assembly 6 when unfolded. In FIG. 1, the printed circuit board assembly is illustrated as folded around the battery. The printed circuit board assembly 6 comprises: a first circuit board 8; a second circuit board 10; a third circuit board 12 interconnected with the first circuit board 8 and the second circuit board 10; and a fourth circuit board 14.

Figure 3:
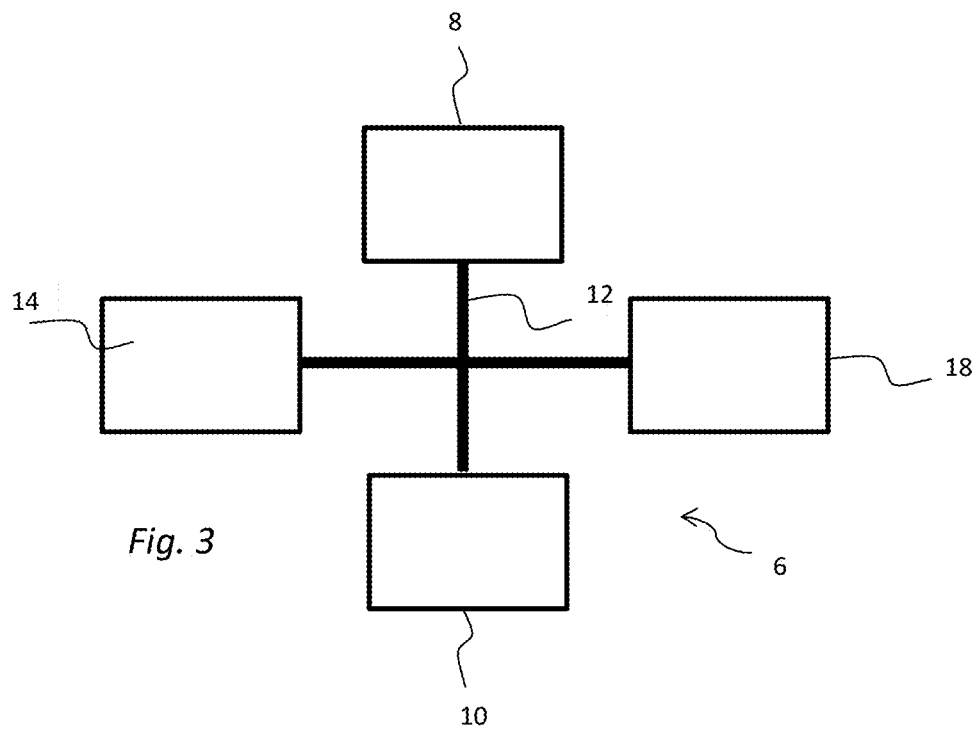
FIG. 3 schematically illustrates an example of a printed circuit board assembly when unfolded.

FIG. 3 schematically illustrates an example of a printed circuit board assembly 6 when unfolded. In FIG. 1, the printed circuit board assembly is illustrated as folded around the battery. The printed circuit board assembly 6 comprises: a first circuit board 8; a second circuit board 10; a third circuit board 12 interconnected with the first circuit board 8 and the second circuit board 10; and a fourth circuit board 14. The printed circuit board assembly 6 further comprises a fifth circuit board 18. The fifth circuit board 18 is connected with the third circuit board 12. The first circuit board 8 and the second circuit board 10 are opposite each other when the printed circuit board assembly 6 is folded about the battery. The fourth circuit board 14 and the fifth circuit board 18 are opposite each other when the printed circuit board assembly 6 is folded about the battery.

Figure 4A:
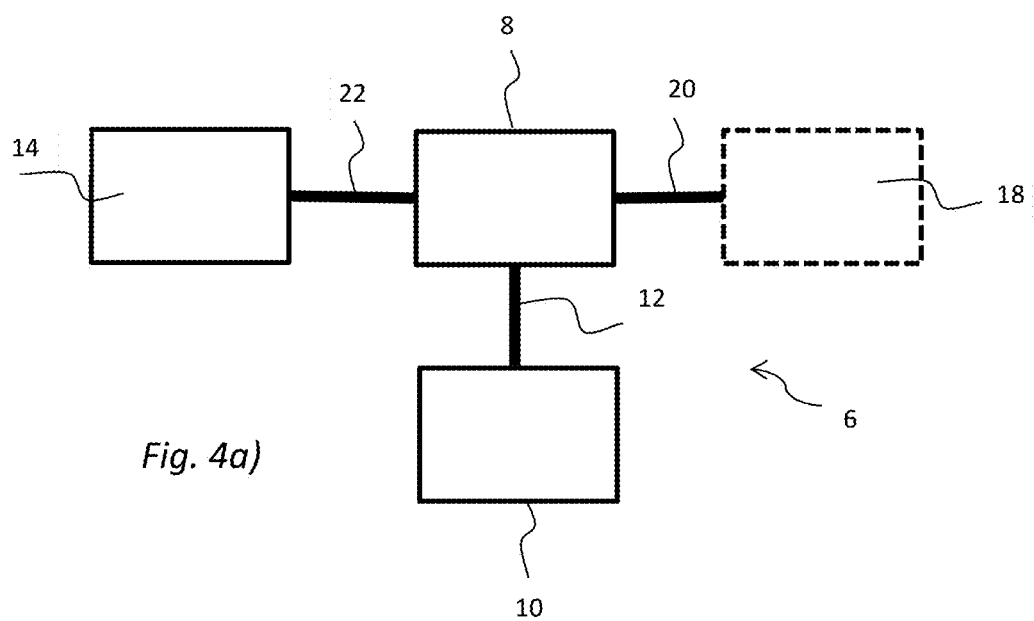
FIGS. 4a), 4b), 4c), and 4d) all schematically illustrates an example of a printed circuit board assembly when unfolded.

FIGS. 4*a*), 4*b*), 4*c*), and 4*d*) all schematically illustrates an example of a printed circuit board assembly 6 when unfolded. In FIG. 1, the printed circuit board assembly is illustrated as folded around the battery. The printed circuit board assembly 6 comprises: a first circuit board 8; a second circuit board 10; a third circuit board 12 interconnected with the first circuit board 8 and the second circuit board 10; and a fourth circuit board 14. The printed circuit board assembly 6 further comprises a fifth circuit board 18. The first circuit board 8 and the second circuit board 10 are opposite each other when the printed circuit board assembly 6 is folded about the battery. The fourth circuit board 14 and the fifth circuit board 18 are opposite each other when the printed circuit board assembly 6 is folded about the battery.

The fourth circuit board 14 and the fifth circuit board 18 may be arranged adjacent the side faces, such as adjacent the lateral side face, of the battery.

In FIG. 4*a*), the fifth circuit board 18 is connected with the first circuit board 8 via a second flexible circuit board 20. The fourth circuit board 14 is connected with the first circuit board 8 via a third flexible circuit board 22.

Figure 4B:
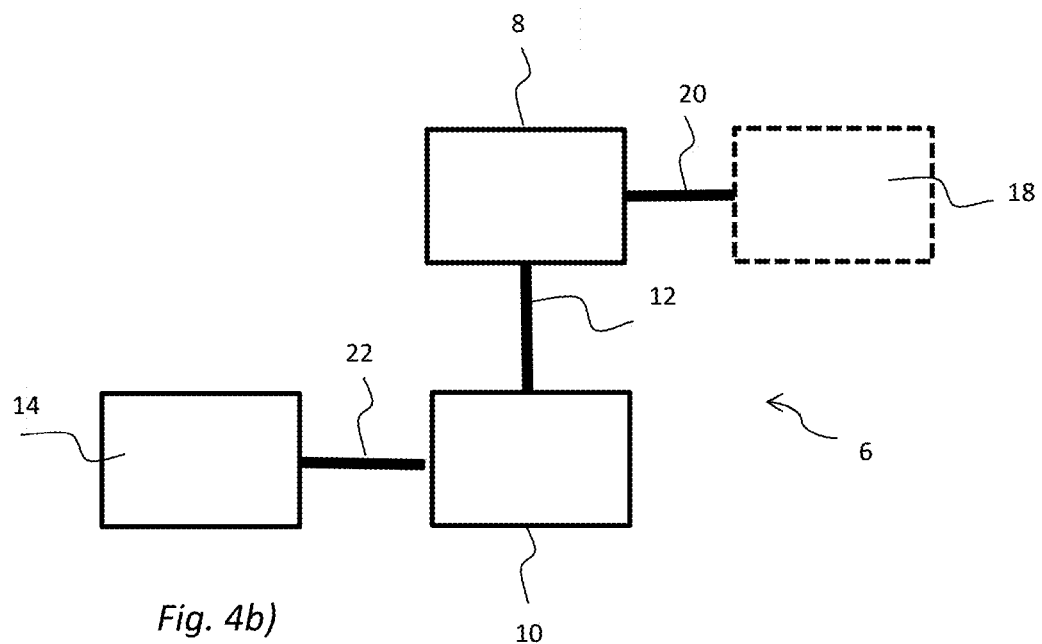

In FIG. 4*b*), the fourth circuit board 14 is connected with the second circuit board 10 via a third flexible circuit board 22. The fifth circuit board 18 may be optional. The fifth circuit board 18 is connected with the first circuit board 8 via a second flexible circuit board 20.

Figure 4C:
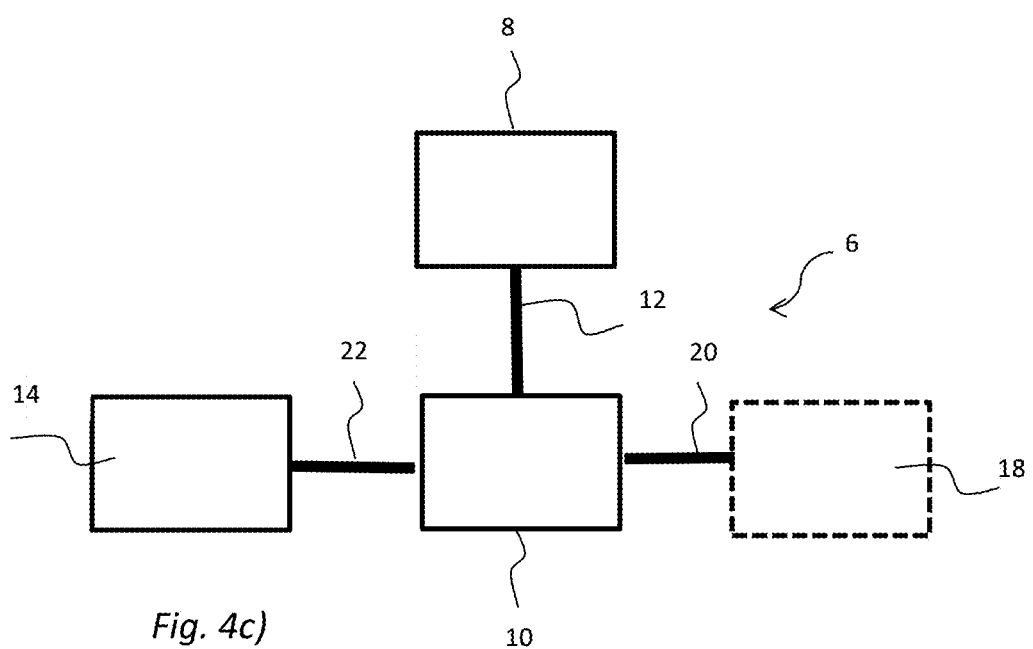

In FIG. 4*c*), the fourth circuit board 14 is connected with the second circuit board 10 via a third flexible circuit board 22. The fifth circuit board 18 may be optional. The fifth circuit board 18 is connected with the second circuit board 10 via a second flexible circuit board 20.

Figure 4D:
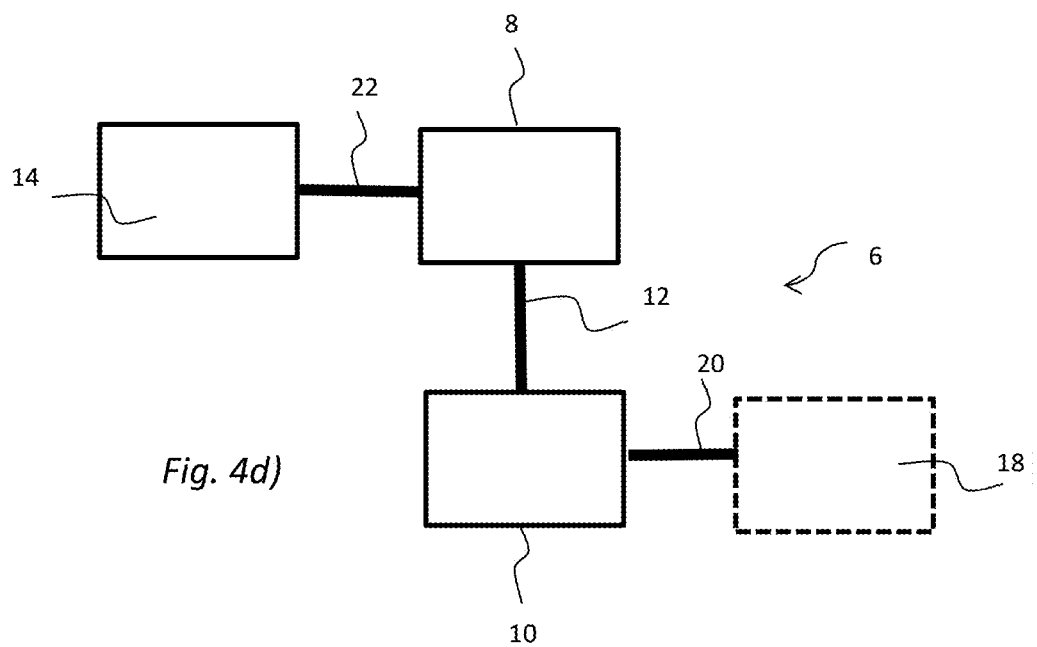

In FIG. 4*d*), the fourth circuit board 14 is connected with the first circuit board 8 via a third flexible circuit board 22. The fifth circuit board 18 may be optional. The fifth circuit board 18 is connected with the second circuit board 10 via a second flexible circuit board 20.

Figure 5:
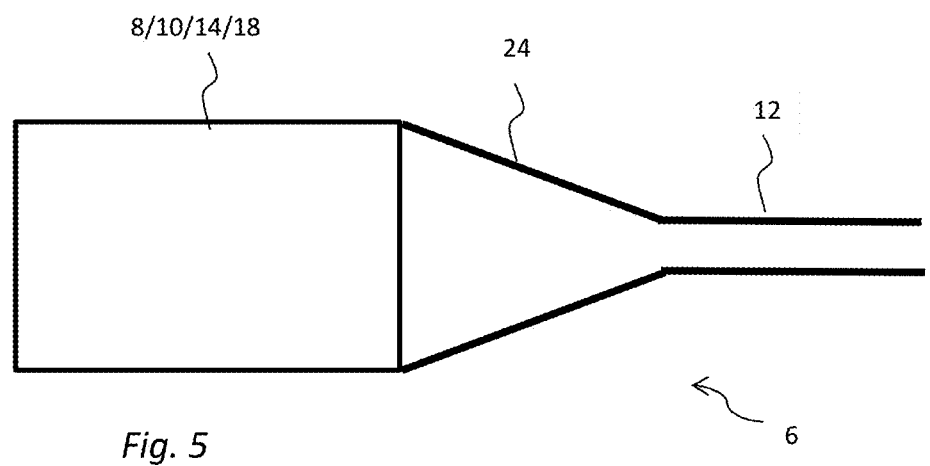
FIG. 5 schematically illustrates an example of a transition zone of the third circuit board of the printed circuit board assembly.

FIG. 5 schematically illustrates an example of a transition zone 24 of the third circuit board 12 of the printed circuit board assembly 6. The third circuit board 12 may comprise a transition zone 24 at the connection with the first 8, second 12, fourth 14 and/or firth circuit board 18. The thickness of the third circuit board 12 in the transition zone 24 gradually increases towards the first 8, second 10, fourth 14 and/or firth 18 circuit boards. The maximum thickness of the third circuit board 12 may be in a range of 0.4-0.6 mm, such as about 0.5 mm, such as 0.53 mm. The width of the third circuit board 12 in the transition zone 24 may also gradually increase towards the first 8, second 12, fourth 14 and/or firth 18 circuit boards.

Figure 6:
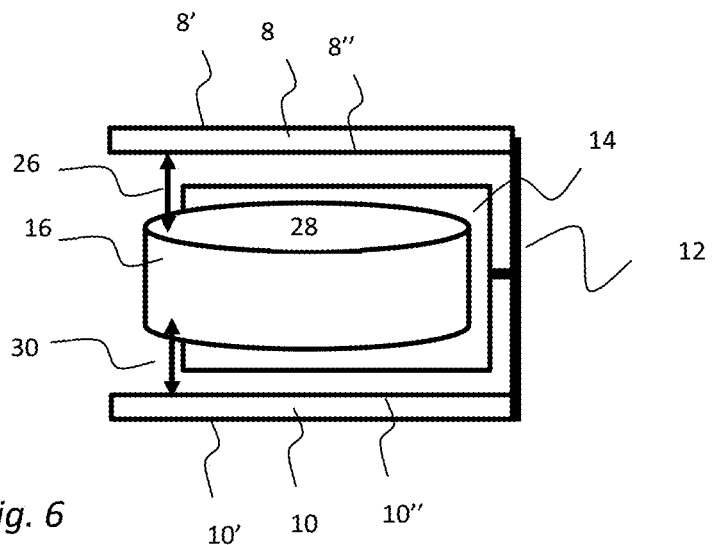
FIG. 6 schematically illustrates an example of a first/second distance between the battery and the first/second circuit board.

FIG. 6 schematically illustrates an example of a first distance 26 between the first major face 28 of the battery 16 and the first circuit board 8. The first distance 26 may have a first predefined value.

FIG. 6 further illustrates a second distance 30 between the second major face (not shown, as it is the face of the battery pointing downwards in the figure) of the battery 16 and the second circuit board 10. The second distance 30 may have a second predefined value.

The first 26 and second 30 distance provides an air gap between the respective circuit board 8, 10 and the battery 16. The surface of the respective circuit board 8, 10 pointing towards the battery 16, when the printed circuit board assembly 6 is folded about the battery 16, is the second surface 8", 10" of the respective circuit board 8, 10.

The surface of the respective circuit board 8, 10 pointing towards the surroundings, when the printed circuit board assembly 6 is folded about the battery 16, is the first surface 8', 10' of the respective circuit board 8, 10. Thus, the second surface 8" of the first circuit board 8 is opposite the second surface 10" of the second circuit board 10. The first distance 26 is between the first major face 28 of the battery 16 and the second surface 8" of the first circuit board 8. The second distance 30 is between the second major face of the battery 16 and the second surface 10" of the second circuit board 10. The first distance 26 and/or the second distance 30 may be 200-400 micrometer, preferably about 300 micrometer.

Figure 7A:
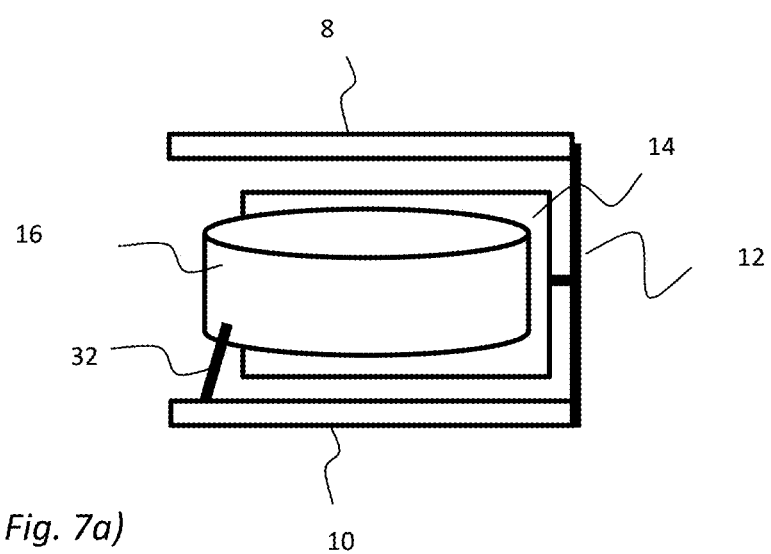
FIG. 7a), b) and c) schematically illustrates an example of a hearing device configured to be worn in an ear of a user.

FIG. 7*a*), *b*) and *c*) schematically illustrates an example of a hearing device 2 configured to be worn in an ear of a user. The hearing device 2 is configured to provide an audio signal to the user. The hearing device 2 comprises a circuit assembly 4. The circuit assembly 4 comprises a printed circuit board assembly 6. The printed circuit board assembly 6 comprises: a first circuit board 8; a second circuit board 10; and a third circuit board 12 interconnected with the first circuit board 8 and the second circuit board 10, and a fourth circuit board 14.

FIG. 7*a*) schematically illustrates an example of the battery 16 being connected to the printed circuit board assembly 6 through a second electronic component 32. The second electronic component 32 may be connected to the second circuit board 10. The second electronic component 32 may be a coil, or an inductor or the like. The second electronic component 32 may be configured to decouple at 2.4 GHz.

Figure 7B:
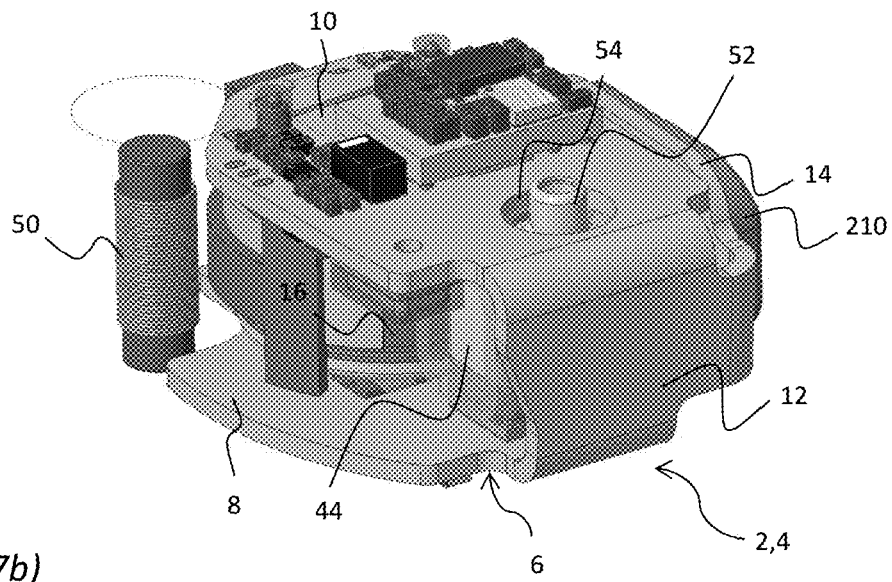
Figure 7C:
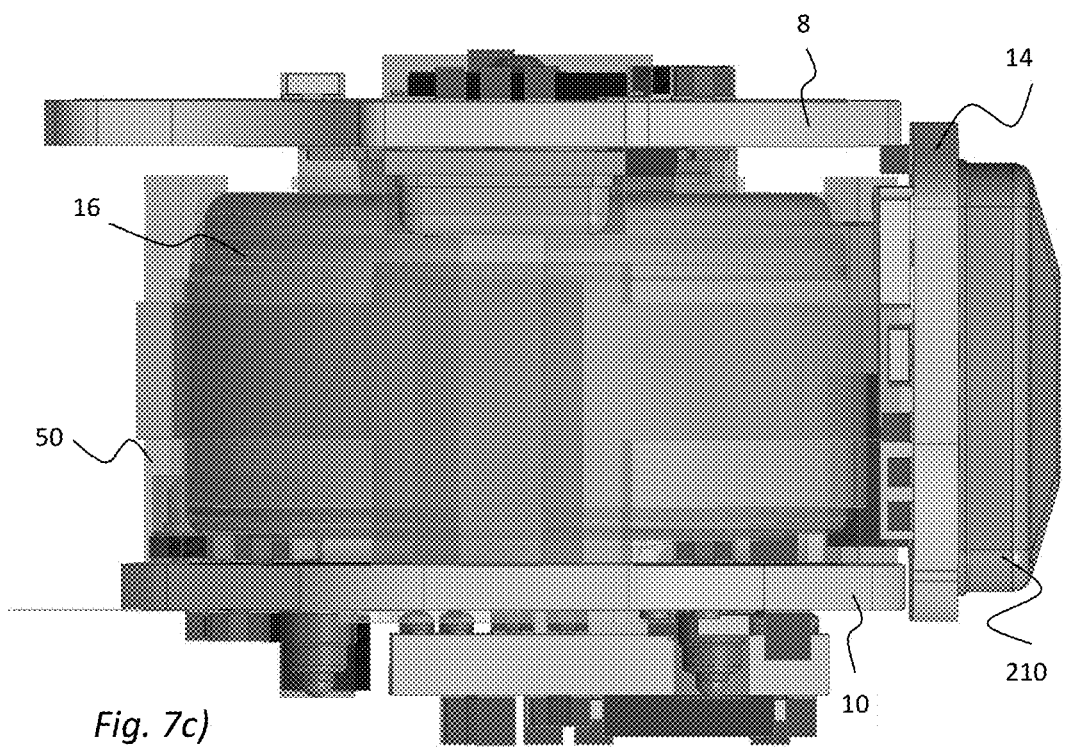

FIG. 7b) shows an output transducer 44 for providing the audio signal. The printed circuit board assembly 6 is folded about the battery 16 and the output transducer 44.

FIG. 7b) shows that the output transducer 44 comprises a protrusion 52 for providing a sound output. The second circuit board 10 comprises a hole 54. The protrusion 52 extends through the hole 54.

FIGS. 7b) and 7c) shows a power management component 210 provided on the fourth circuit board 14.

FIGS. 7b) and 7c) shows a magnetic induction coil 50.

FIG. 7b) shows that the magnetic induction coil 50 is provided opposite the output transducer 44. The battery 16 is arranged between the magnetic induction coil 50 and the output transducer 44.

Figure 8:
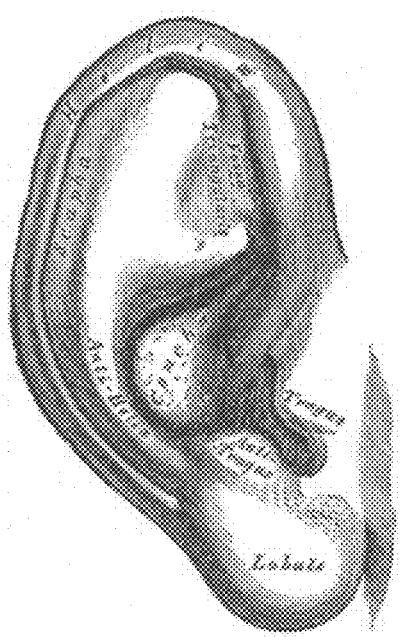
FIG. 8 schematically illustrates an example of the position of the hearing device in the ear during operational use of the hearing device.
Figure 8:
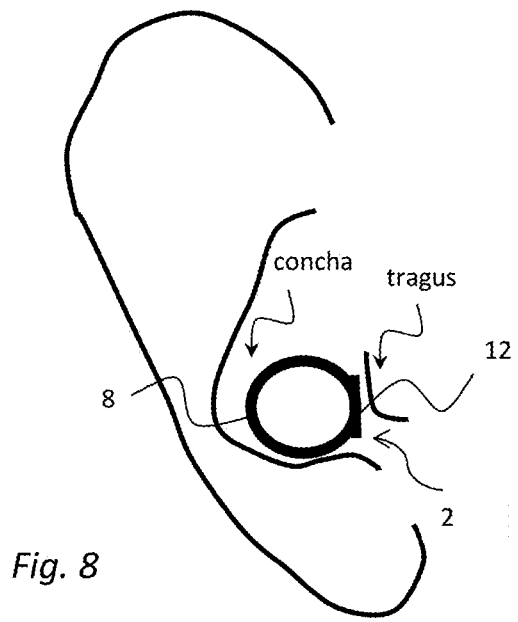

FIG. 8 left side shows an illustration of ear anatomy. FIG. 8 right side schematically illustrates an example where during operational use of the hearing device 2, the circuit assembly 4 is arranged such that the third circuit board 12 is provided adjacent the tragus in the ear. The first circuit board 8 of the printed circuit board assembly 6 of the circuit assembly 4 is configured to point outwards to the surroundings. The second circuit board 10 is configured to point inwards to the flesh of the ear. The hearing device 2 is configured to be arranged at the concha of the ear.

Figure 9:
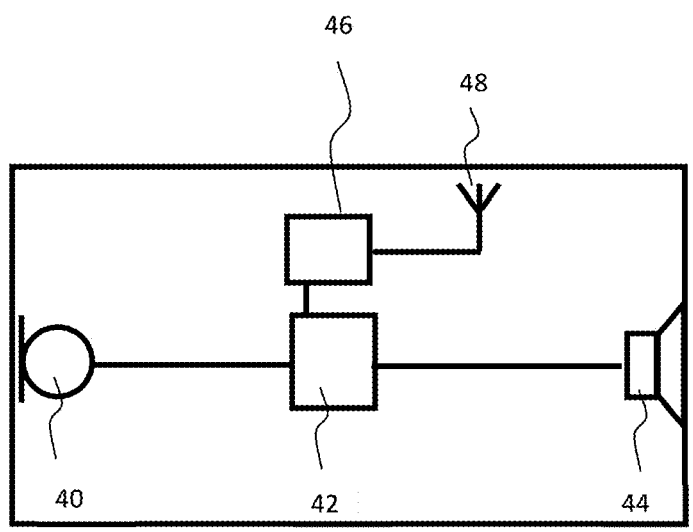
FIG. 9 schematically illustrates an example of a hearing device.

FIG. 9 schematically illustrates an example of a hearing device 2, such as a hearing aid. The hearing device 2 comprises a microphone 40, for receiving an input signal and converting it into an audio signal. The audio signal is provided to a processing unit 42 for processing the audio signal and providing a processed output signal for compensating a hearing loss of a user of the hearing device 2. An output transducer 44 is connected to an output of the processing unit 42 for converting the processed output signal into an output sound signal, e.g. a signal modified to compensate for a user's hearing impairment. The output transducer 44 is often referred to as a receiver or speaker. The processing unit 42 may comprise elements such as amplifiers, compressors, noise reduction systems, etc. The hearing device 2 may further comprise a wireless communication unit 46 for wireless data communication interconnected with an antenna element/structure 48 for emission and reception of an electromagnetic field. The wireless communication unit 46, such as a radio or a transceiver, connects to the processing unit 42 and the antenna structure 48, for communicating with an electronic device, an external device, or with another hearing device, such as another hearing aid located in/on/at another ear of the user, typically in a binaural hearing system. The hearing device 2 may comprise two or more antenna structures.

The hearing device 2 may be an in-the-ear hearing device and may be provided as an in-the-ear module. Alternatively, parts of the hearing device 2 may be provided in a behind-the-ear module, while other parts, such as the output transducer 44, may be provided in an in-the-ear module.

Figure 10A:
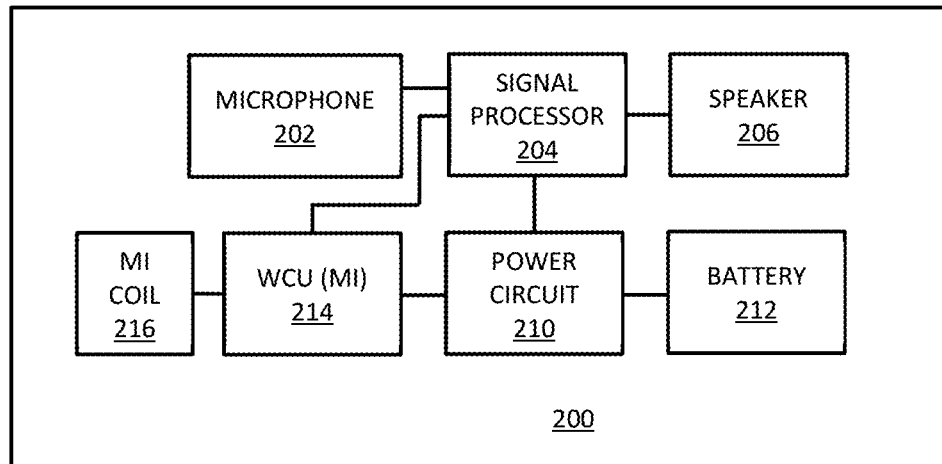
FIGS. 10a) and 10b) schematically illustrate an example of a block-diagram of an embodiment of a hearing device.

FIGS. 10a) and 10b) schematically illustrate an example of a block-diagram of an embodiment of a hearing device 200. In FIG. 10a), the hearing device 200 comprises a first transducer, i.e. microphone 202, to generate one or more microphone output signals based on a received an audio signal. The one or more microphone output signals are provided to a signal processor 204 for processing the one or more microphone output signals. An output transducer or receiver or speaker 206 is connected to an output of the signal processor 204 for converting the output of the signal processor into a signal modified to compensate for a user's hearing impairment, and provides the modified signal to the speaker 206.

The hearing device signal processor 204 may comprise elements such as an amplifier, a compressor and/or a noise reduction system etc. The signal processor 204 may be implemented in a signal processing chip 204'. The hearing device may further have a filter function, such as compensation filter for optimizing the output signal.

The hearing device further comprises a wireless communication unit 214 interconnected with magnetic induction antenna 216 such as a magnetic induction coil. The wireless communication unit 214 and the magnetic induction antenna 216 may be configured for wireless data communication using emission and reception of magnetic field. The wireless communication unit may be implemented as a wireless communication chip 214', such as a magnetic induction control chip 214'. The hearing device 200 further comprises a power source 212, such as a battery or a rechargeable battery. Furthermore, a power management unit 210 is provided for controlling the power provided from the battery 212 to the signal processor 204, the output transducer, the one or more microphones, the wireless communication unit (RF) 208, and the wireless communication unit (MI) 214. The magnetic induction antenna is configured for communication with another electronic device, in some embodiments configured for communication with another hearing device, such as another hearing device located at another ear, typically in a binaural hearing device system.

The hearing device may furthermore have a wireless communication unit 208, such as a wireless communication circuit, for wireless data communication interconnected with an RF antenna 218 for emission and reception of an electromagnetic field. The wireless communication unit may be implemented as a wireless communication chip 208'. The wireless communication unit 208, including a radio or a transceiver, connect to the hearing device signal processor 204 and the RF antenna 218, for communicating with one or more external devices, such as one or more external electronic devices, including at least one smart phone, at least one tablet, at least one hearing accessory device, including at least one spouse microphone, remote control, audio testing device, etc., or, in some embodiments, with another hearing device, such as another hearing device located at another ear, typically in a binaural hearing device system.

The signal processor 204, the wireless communication unit (RF) 208, the wireless communication unit (MI) 214 and the power management unit 210 may be implemented as signal processing chip 204', wireless communication chip (RF) 208', wireless communication chip (MI) 214' and power management chip 210', respectively.

Figure 10B:
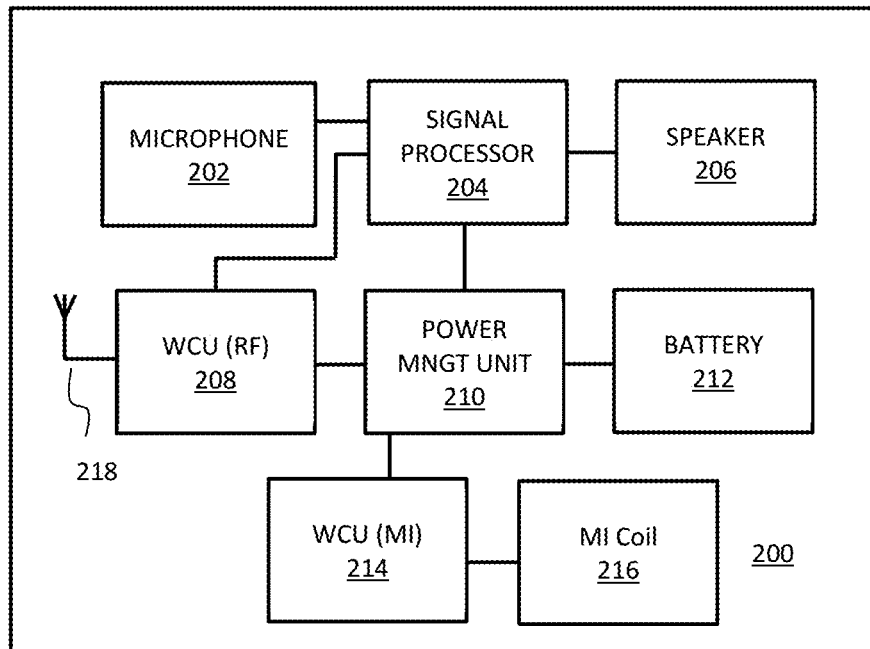

In FIG. 10b), a hearing device corresponding to the hearing device as shown in FIG. 10a is seen, except that in FIG. 10b, only one wireless communication unit 214 is present being interconnected with the magnetic induction antenna 216, the signal processor 204 and the power management unit 210.

Likewise, even though not shown, also a hearing device having only one wireless communication unit 208 being interconnected with an RF antenna for reception and emission of an electromagnetic field is envisaged.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

Items

1. A hearing device configured to be worn in an ear of a user, the hearing device being configured to provide an audio signal to the user, the hearing device comprising:
   a circuit assembly, comprising:
      a printed circuit board assembly, comprising:
         a first circuit board;
         a second circuit board;
         a third circuit board interconnected with the first circuit board and the second circuit board;
         a fourth circuit board; and
      a battery, wherein the printed circuit board assembly is folded about the battery.
2. A hearing device according to any of the preceding items, wherein the first, second and fourth circuit boards are printed circuit boards, and wherein the third circuit board is a flexible circuit board.
3. A hearing device according to any of the preceding items, wherein the first circuit board and second circuit board are arranged opposite each other.
4. A hearing device according to any of the preceding items, wherein the battery comprises a first major face, a second major face and one or more side faces; and wherein the printed circuit board assembly is folded about the battery with the first circuit board adjacent the first major face, the second circuit board adjacent the second major face, the third circuit board adjacent at least one of the one or more side faces and the fourth circuit board adjacent at least one of the one or more side faces.
5. A hearing device according to any of the preceding items, wherein the third circuit board comprises one or more bends.
6. A hearing device according to any of the preceding items, wherein the fourth circuit board is interconnected, via the third circuit board, with the first circuit board and the second circuit board.
7. A hearing device according to any of the preceding items, further comprising a fifth circuit board.
8. A hearing device according to the preceding items, wherein the fourth circuit board and the fifth circuit board are arranged opposite each other.
9. A hearing device according to any of the preceding items, wherein the fifth circuit board is interconnected, via the third circuit board, with the first circuit board and the second circuit board.
10. A hearing device according to any of the preceding items, wherein the fourth circuit board and/or the fifth circuit board is/are connected with the first circuit board.
11. A hearing device according to any of the preceding items, wherein the fourth circuit board and/or the fifth circuit board is/are connected with the second circuit board.
12. A hearing device according to any of the preceding items, further comprising power management components, wherein the power management components are provided at the fourth circuit board.
13. A hearing device according to any of the preceding items, further comprising a magnetic induction coil and, wherein the magnetic induction coil is provided opposite the fourth circuit board.
14. A hearing device according to any of the preceding items, wherein the third circuit board has a width, and wherein the third circuit board is connected to the first circuit board and the second circuit board along its entire width.
15. A hearing device according to any of the preceding items, wherein the third circuit board comprises a transition zone at the connection with the first, second, fourth and/or fifth circuit board, wherein the thickness of the third circuit board in the transition zone gradually increases
16. A hearing device according to any of the preceding items, further comprising one or more microphones and/or one or more control interfaces, wherein the one or more microphones and/or the one or more control interfaces are provided at the first circuit board.
17. A hearing device according to any of the preceding items, wherein the battery is connected to the printed circuit board assembly through a second electronic component.
18. A hearing device according to any of the preceding items, further comprising an antenna comprising an antenna element, the antenna being configured for emission and reception of electromagnetic radiation at a wavelength (A); and where the hearing device further comprises a wireless communication unit interconnected with the antenna element.
19. A hearing device according to the preceding item, wherein the antenna element has a first end connected to a feed, wherein the feed is provided in a portion of the first or third circuit board which is adjacent to the interconnection between the first and third circuit boards.
20. A hearing device according to any of the preceding items, further comprising a first distance between the first major face of the battery and the first circuit board, the first distance having a first predefined value; and/or a second distance between the second major face of the battery and the second circuit board, the second distance having a second predefined value.
21. A hearing device according to the preceding items, wherein the first distance and/or the second distance is 200-400 micrometer, preferably about 300 micrometer.
22. A hearing device according to any of the preceding items, wherein, during operational use of the hearing device, the circuit assembly is arranged such that the third circuit board is provided adjacent the tragus in the ear.
23. A hearing device according to any of the preceding items, wherein, during operational use of the hearing device, the circuit assembly is arranged such that a first surface of the first circuit board faces towards the surroundings outside of the ear, and a second surface of the first circuit board faces towards the concha of the ear, where the first surface is opposite to the second surface.
24. A hearing device according to any of the preceding items, further comprising an output transducer for providing the audio signal.

LIST OF REFERENCES 2 hearing device 2
4 circuit assembly
6 printed circuit board assembly
8 first circuit board
8' first surface of first circuit board
8" second surface of first circuit board
10 second circuit board
10' first surface of second circuit board
10" second surface of second circuit board
12 third circuit board
14 fourth circuit board
16 battery
18 fifth circuit board
20 second flexible circuit board
22 third flexible circuit board
24 transition zone
26 first distance
28 first major face 28

30 second distance
32 second electronic component
40 microphone
42 processing unit
44 output transducer
46 wireless communication unit
48 antenna element/structure
50 magnetic induction (MI) coil
52 protrusion
54 hole
200 hearing device
202 first transducer
204 signal processor
206 output transducer
208 wireless communication unit/chip (RF)
210 power management components
214 wireless communication unit/chip (MI)
216 magnetic induction antenna
218 radio frequency (RF) antenna

The invention claimed is:

1. A hearing device configured to be worn in an ear of a user, the hearing device being configured to provide an audio signal to the user, the hearing device comprising:
   a printed circuit board assembly, comprising:
      a first circuit board,
      a second circuit board,
      a third circuit board connected with the first circuit board and the second circuit board, and
      a fourth circuit board; and
   a battery, wherein the printed circuit board assembly is folded about the battery;
   wherein the fourth circuit board is connected with the first circuit board and the second circuit board via the third circuit board.

2. The hearing device according to claim 1, wherein the first, second and fourth circuit boards are printed circuit boards, and wherein the third circuit board is a flexible circuit board.

3. The hearing device according to claim 1, wherein the first circuit board and the second circuit board are opposite from each other.

4. The hearing device according to claim 1, wherein the battery comprises a first major face, a second major face, and one or more side faces; and
   wherein the printed circuit board assembly is folded about the battery with the first circuit board facing the first major face, with the second circuit board facing the second major face, with the third circuit board facing at least one of the one or more side faces.

5. The hearing device according to claim 1, wherein the third circuit board comprises one or more bends.

6. The hearing device according to claim 1, further comprising a fifth circuit board.

7. The hearing device according to claim 6, wherein the fourth circuit board and the fifth circuit board are opposite from each other.

8. The hearing device according to claim 6, wherein the fifth circuit board is connected indirectly with the first circuit board and the second circuit board via the third circuit board.

9. The hearing device according to claim 6, wherein the fifth circuit board is connected with the first circuit board.

10. The hearing device according to claim 6, wherein the fifth circuit board is connected with the second circuit board.

11. The hearing device according to claim 1, further comprising a power management component, wherein the power management component is at the fourth circuit board.

12. The hearing device according to claim 1, further comprising a magnetic induction coil, wherein the magnetic induction coil is opposite from the fourth circuit board.

13. The hearing device according to claim 1, wherein the third circuit board has a width, and wherein the third circuit board is connected to the first circuit board and the second circuit board along an entirety of the width of the third circuit board.

14. The hearing device according to claim 1, wherein the third circuit board comprises a transition zone at a connection with the first circuit board, second circuit board, or the fourth circuit board, and wherein a thickness of the third circuit board in the transition zone has a tapering configuration.

15. The hearing device according to claim 1, wherein the first circuit board, the second circuit board, and the third circuit board are parts of a unity structure.

16. The hearing device according to claim 1, wherein the first circuit board, the second circuit board, and the third circuit board comprise respective parts of a substrate.

17. The hearing device according to claim 16, wherein the fourth circuit board comprises another part of the substrate.

18. The hearing device according to claim 1, wherein the third circuit board is connected between the first circuit board and the second circuit board.

\* \* \* \* \*